US009646665B2

(12) United States Patent
Ho et al.

(10) Patent No.: US 9,646,665 B2
(45) Date of Patent: May 9, 2017

(54) LOOK-UP TABLE CIRCUIT AND NONVOLATILE MEMORY DEVICE

(71) Applicant: KABUSHIKI KAISHA TOSHIBA, Tokyo (JP)

(72) Inventors: Yinghao Ho, Kanagawa (JP); Koichiro Zaitsu, Kanagawa (JP); Shinichi Yasuda, Tokyo (JP); Kosuke Tatsumura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/988,241

(22) Filed: Jan. 5, 2016

(65) Prior Publication Data

US 2016/0203860 A1 Jul. 14, 2016

(30) Foreign Application Priority Data

Jan. 9, 2015 (JP) ................................ 2015-003626

(51) Int. Cl.
*G11C 11/16* (2006.01)
*G11C 13/00* (2006.01)
(Continued)

(52) U.S. Cl.
CPC .......... *G11C 11/16* (2013.01); *G11C 13/0002* (2013.01); *G11C 13/0007* (2013.01);
(Continued)

(58) Field of Classification Search
CPC ..... G11C 11/16; G11C 13/0002; G11C 5/025; H01L 45/085; H01L 45/146;
(Continued)

(56) References Cited

U.S. PATENT DOCUMENTS

2003/0123281 A1* 7/2003 Iwata ...................... G11C 11/16
365/158
2004/0141364 A1 7/2004 Perner et al.
(Continued)

FOREIGN PATENT DOCUMENTS

JP 2004-227754 8/2004
JP 2012-169023 9/2012
(Continued)

OTHER PUBLICATIONS

Chen, Y., et al., "Insights into Ni-flament formation in unipolar-switching Ni/HfO2//TiN resistive random access memory device", Applied Physics Letters 100, pp. 113513-1 to 11513-4 (2012).
(Continued)

*Primary Examiner* — Pho M Luu
*Assistant Examiner* — Ajay Ojha
(74) *Attorney, Agent, or Firm* — Finnegan, Henderson, Farabow, Garrett & Dunner, LLP

(57) ABSTRACT

A look-up table circuit of an embodiment includes: first wiring lines; second wiring lines; resistive change elements disposed to intersection regions of the first and second wiring lines, each resistive change element including a first electrode connected to a corresponding one of the first wiring lines, a second electrode connected to a corresponding one of the second wiring lines; and a resistive change layer disposed between the first electrode and the second electrode; a first controller controlling voltages applied to the first wiring lines; a second controller controlling voltages applied to the second wiring lines; and a multiplexer including input terminals connected to the first wiring lines and an output terminal.

24 Claims, 11 Drawing Sheets

(51) Int. Cl.

| | |
|---|---|
| ***H01L 27/24*** | (2006.01) |
| ***H01L 45/00*** | (2006.01) |
| *G11C 5/02* | (2006.01) |
| *G11C 7/20* | (2006.01) |
| *G11C 29/44* | (2006.01) |

(52) U.S. Cl.
CPC ...... *G11C 13/0069* (2013.01); *H01L 27/2436* (2013.01); *H01L 27/2463* (2013.01); *H01L 45/04* (2013.01); *H01L 45/06* (2013.01); *H01L 45/085* (2013.01); *H01L 45/126* (2013.01); *H01L 45/1233* (2013.01); *H01L 45/1253* (2013.01); *H01L 45/145* (2013.01); *H01L 45/146* (2013.01); *G11C 5/025* (2013.01); *G11C 7/20* (2013.01); *G11C 2029/4402* (2013.01); *G11C 2213/32* (2013.01); *G11C 2213/52* (2013.01); *G11C 2213/77* (2013.01)

(58) Field of Classification Search
CPC ............. H01L 27/2463; H01L 45/1233; H01L 45/145; H01L 27/2436; H01L 45/126
See application file for complete search history.

(56) References Cited

U.S. PATENT DOCUMENTS

| | | | | |
|---|---|---|---|---|
| 2008/0002457 | A1* | 1/2008 | Toda .................. | G11C 11/5678 365/148 |
| 2010/0271885 | A1* | 10/2010 | Scheuerlein ........... | G11C 5/025 365/189.09 |
| 2010/0308298 | A1 | 12/2010 | Ninomiya et al. | |
| 2013/0034947 | A1* | 2/2013 | Hong ...................... | H01L 45/04 438/384 |
| 2013/0210211 | A1* | 8/2013 | Vereen ................ | H01L 45/1233 438/382 |
| 2013/0235646 | A1 | 9/2013 | Nojiri et al. | |
| 2013/0250654 | A1* | 9/2013 | Sugimae ............ | G11C 13/0002 365/148 |
| 2014/0077144 | A1 | 3/2014 | Yoneda | |
| 2014/0346584 | A1* | 11/2014 | Purayath ........... | H01L 21/28273 257/321 |
| 2016/0141493 | A1 | 5/2016 | Seki et al. | |

FOREIGN PATENT DOCUMENTS

| | | |
|---|---|---|
| JP | 2012-185870 | 9/2012 |
| JP | 2013-122985 | 6/2013 |
| JP | 2014-75576 | 4/2014 |
| JP | 2015-18590 | 1/2015 |
| JP | 2016-100416 | 5/2016 |
| WO | WO 2010/038423 | 4/2010 |
| WO | WO 2015/005149 A1 | 1/2015 |

OTHER PUBLICATIONS

Chen, W., "IC Process Compatible Anodic Electrode Structures for Unipolar HfOx-based RRAM", International Symposium on VLSI Technology, Systems, and Applications, Proceedings 2011, Article No. 5872249, pp. 102-103.

* cited by examiner

| B | L | S | R | OUT |
| --- | --- | --- | --- | --- |
| 0 | * | * | * | F |
| 1 | 0 | * | * | Vinh |
| 1 | 1 | 0 | 0 | Vinh |
| 1 | 1 | 1 | 0 | 0 (#) |
| 1 | 1 | 0 | 1 | 0 |

B: BLOCK ADDRESS SIGNAL
L: LOCAL ADDRESS SIGNAL
S: SET ENABLE SIGNAL
R: RESET ENABLE SIGNAL

| B | L | S | R | OUT |
|---|---|---|---|---|
| 0 | * | * | * | F |
| 1 | 0 | * | * | Vinh |
| 1 | 1 | 0 | 0 | Vinh |
| 1 | 1 | 1 | 0 | $V_{pgm}$ |
| 1 | 1 | 0 | 1 | $V_{pgm}$ |

B: BLOCK ADDRESS SIGNAL
L: LOCAL ADDRESS SIGNAL
S: SET ENABLE SIGNAL
R: RESET ENABLE SIGNAL

| B | L | S | R | OUT |
|---|---|---|---|---|
| 0 | * | * | * | F |
| 1 | 0 | * | * | Vinh |
| 1 | 1 | 0 | 0 | Vinh |
| 1 | 1 | 1 | 0 | 0 (#) |
| 1 | 1 | 0 | 1 | 0 |

(#) CURRENT IS LIMITED.

LOOK-UP TABLE CIRCUIT AND NONVOLATILE MEMORY DEVICE

CROSS REFERENCE TO RELATED APPLICATIONS

This application is based upon and claims the benefit of priority from prior Japanese Patent Application No. 2015-003626 filed on Jan. 9, 2015 in Japan, the entire contents of which are incorporated herein by reference.

FIELD

Embodiments described herein relate generally to look-up table circuits and nonvolatile memory devices.

BACKGROUND

Look-up table circuits store logics in memories, and control outputs based on the contents of data stored in the memories. Reconfigurable circuits including look-up table circuits are capable of dealing with arbitrarily selected logical operations, but are difficult to be highly integrated since the number of elements in look-up table circuits is large.

Look-up table circuits formed by using complementary metal oxide semiconductor (CMOS) techniques may include static random access memories (SRAMs) to store data. This configuration includes a large number of elements, which is one of the reasons the look-up table circuits cannot be highly integrated. Furthermore, the SRAMs are volatile memories which lose data when the power is turned off. Therefore, every time the power is turned on, data having been saved in external memories should be rewritten to the SRAMs.

This may take time and effort. Furthermore, the external memories for saving data when the power is turned off should always be kept. This may increase the power consumption and increase the entire size. For the above reasons, the entire system cannot be highly integrated or decrease power consumption.

A look-up table circuit with four inputs and one output, which is typically used in a field programmable gate array (FPGA), includes as many as about 166 elements. A SRAM included in the FPGA includes about 96 elements. Thus, the ratio of the SRAM in the total number of elements in the look-up table circuit is large. Therefore, reducing the number of elements in SRAM leads directly means reducing the number of the entire elements in a look-up table circuit. Since the look-up table circuit is a basic circuit in an FPGA, reducing the number of elements in a look-up table circuit would lead to high integration.

DETAILED DESCRIPTION

A look-up table circuit according to an embodiment includes: first wiring lines; second wiring lines crossing the first wiring lines; a plurality of resistive change elements disposed to intersection regions of the first wiring lines and the second wiring lines, each resistive change element including a first electrode connected to a corresponding one of the first wiring lines, a second electrode connected to a corresponding one of the second wiring lines, and a resistive change layer disposed between the first electrode and the second electrode; a first controller configured to control voltages applied to the first wiring lines; a second controller configured to control voltages applied to the second wiring lines; and a multiplexer including input terminals connected to the first wiring lines and an output terminal.

Embodiments will now be explained with reference to the accompanying drawings.

(First Embodiment)

Figure 1:
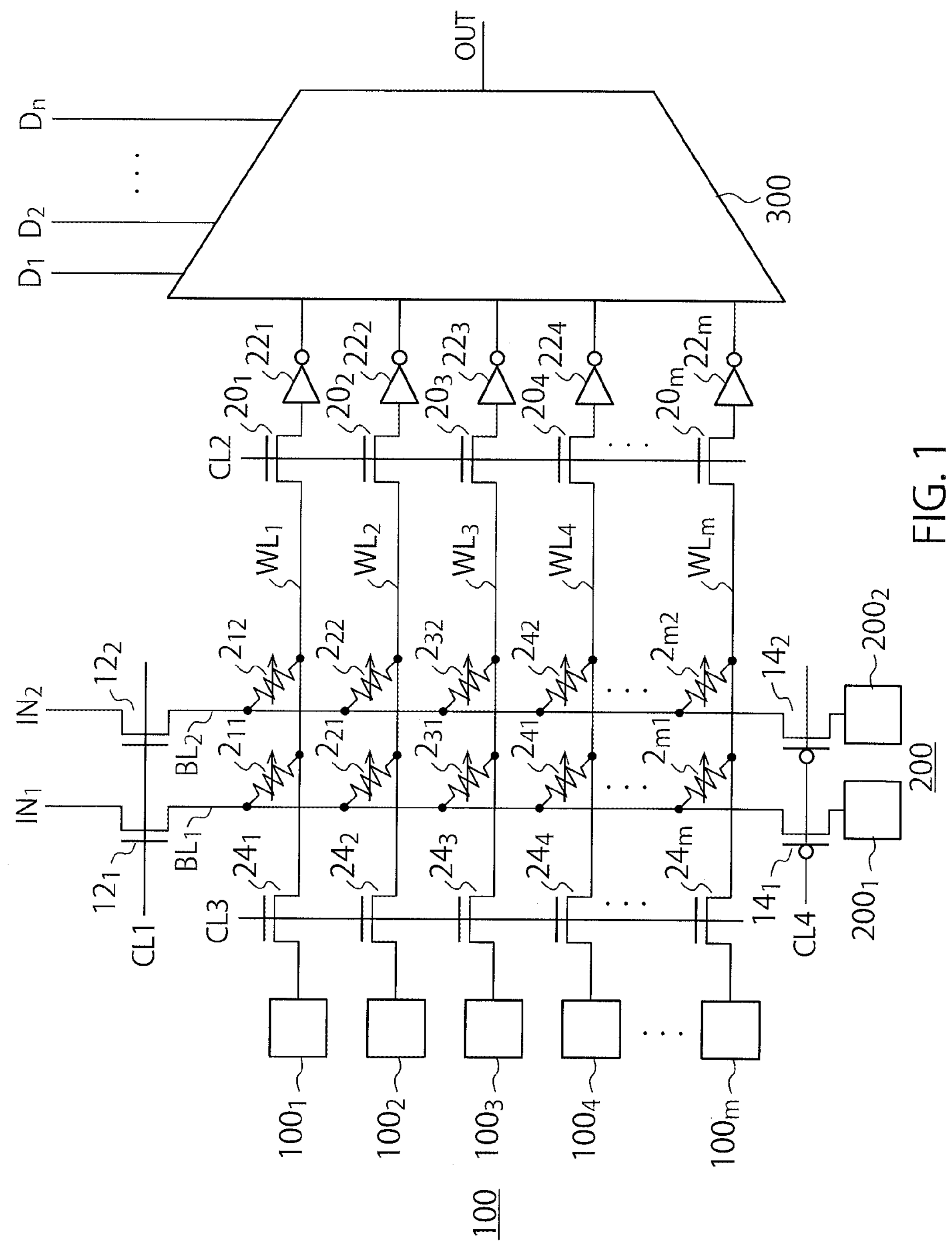
FIG. 1 is a circuit diagram showing a look-up table circuit according to a first embodiment.

FIG. 1 shows a look-up table circuit according to a first embodiment. The look-up table circuit according to the first embodiment includes a plurality of blocks, of which one block is shown in FIG. 1. The block includes a bit line group including two bit lines $BL_1$ and $BL_2$, a plurality of word lines $WL_1$, $WL_2$, . . . , $WL_m$ ($m \geq 2$) crossing the bit lines, memory cells $\mathbf{2}_{ij}$ (i=1, . . . , m, j=1, 2) each being disposed to an intersection region of one of the word lines $WL_i$ (i=1, . . . , m) and one of the bit lines $BL_j$ (j=1, 2), n-channel transistors $\mathbf{12}_1$ and $\mathbf{12}_2$, p-channel transistors $\mathbf{14}_1$ and $\mathbf{14}_2$, n-channel transistors $\mathbf{20}_1$, . . . , $\mathbf{20}_m$, inverters $\mathbf{22}_i$, n-channel transistors $\mathbf{24}_1$, . . . , $\mathbf{24}_m$, a row decoder (row controller) 100, a column decoder (column controller) 200, and a multiplexer 300. The row decoder 100 includes sub-row decoders (sub-row controllers) $\mathbf{100}_1$, . . . , $\mathbf{100}_m$ corresponding to the word lines $WL_1$, $WL_2$, . . . , $WL_m$ ($m \geq 2$). The column decoder 200 includes sub-column decoders (sub-column controllers) $\mathbf{200}_1$ and $\mathbf{200}_2$ corresponding to the bit lines $BL_1$ and $BL_2$. This structure, in which a memory cell $2_{ij}$ is disposed to an intersection region between a word line $WL_i$ (i=1, . . . , m) and a bit line $BL_j$ (j=1, 2), will be called "cross-point structure." The bit line group can include more than two bit lines but m bit lines or less. The bit line group can include at least one redundancy bit line.

In the above descriptions, each block includes the row decoder 100 and the column decoder 200. However, if a plurality of blocks are arranged in a matrix form, some or all the blocks in the same row may share one row decoder 100, and some or all the blocks in the same column may share one column decoder 200.

A first terminal of each of the memory cells $2_{i1}$, $2_{i2}$ (i=1, . . . , m) is connected to the word line $WL_i$. A second terminal of each of memory cells $2_{ij}$-$2_{mj}$ (j=1, 2) is connected to the bit line $BL_j$. The word line $WL_i$ (i=1, . . . , m) is connected to the sub-row decoder $100_i$ via the transistor $24_i$. The gate of the transistor $24_i$ (i=1, . . . , m) is connected to a wiring line CL3. The bit line $BL_j$ (j=1, 2) is connected to the sub-column decoder $200_j$ via the transistor $14_j$. The gate of the transistor $14_j$ (j=1, 2) is connected to a wiring line CL4.

A specific block and a specific word line in the selected block may be selected by the sub-row decoders $100_1$ to $100_m$, and a voltage may be applied to the selected word line in the selected block. A specific block and a specific bit line in the selected block may be selected by the sub-column decoders $200_1$ and $200_2$, and a voltage may be applied to the selected bit line in the selected block. A memory cell selected in the selected block may be programmed in this manner. As will be described later, the sub-row decoders $100_1$-$100_m$ control the voltages applied to the word lines, and the sub-column decoders $200_1$ and $200_2$ control the voltages applied to the bit lines.

A signal inputted to an input line $IN_j$ (j=1, 2) is further inputted to the bit line $BL_j$ via the transistor $12_j$. Data read from the memory cell $2_{ij}$ (i=1, . . . , m, j=1, 2) is sent to the multiplexer 300 via the transistor 20, and the inverter $22_i$. The gate of the transistor $12_j$ (j=1, 2) is connected to a wiring line CL1. The gate of the transistor $20_i$ (i=1, . . . , m) is connected to a wiring line CL2.

The multiplexer 300 includes input terminals connected to the word lines $WL_1$, $WL_2$, . . . , $WL_m$ ($m \geq 2$) and an output terminal OUT, selects one of the input terminals based on signal values of control lines $D_1$-$D_n$, and outputs an information from the output terminal OUT. The information outputted from the output terminal Out corresponds to a signal inputted to the selected one of the input terminals. In FIG. 1, since the input terminals of the multiplexer 300 are connected to the word lines $WL_1$, $WL_2$, . . . , $WL_m$ ($m \geq 2$) through the m inverters $22_1$ to $22_m$, the multiplexer 300 selects one of outputs from the m inverters $22_1$ to $22_m$ based on signal values of control lines $D_1$-$D_n$. A potential of a signal inputted to the selected one of the input terminals is different from a potential of a word line corresponding to the selected one of the input terminals. The inverters $22_1$ to $22_m$ can be deleted. In this case, a potential of a signal inputted to the selected one of the input terminals is the same as a potential of a word line corresponding to the selected one of the input terminals.

(Resistive Change Element)

In the first embodiment, the memory cells $2_{ij}$ (i=1, . . . , m, j=1, 2) are nonvolatile resistive change elements. A resistive change element includes two terminals (electrodes), and the resistance between the terminals may be changed between a low resistive state (LRS) and a high resistive state (HRS). In order to change the state, a predetermined program voltage is applied between the terminals of the resistive change element. Changing the state of the resistive change element from the HRS to the LRS will be called "set," and changing the state from the LRS to the HRS will be called "reset" herein.

Figure 2:
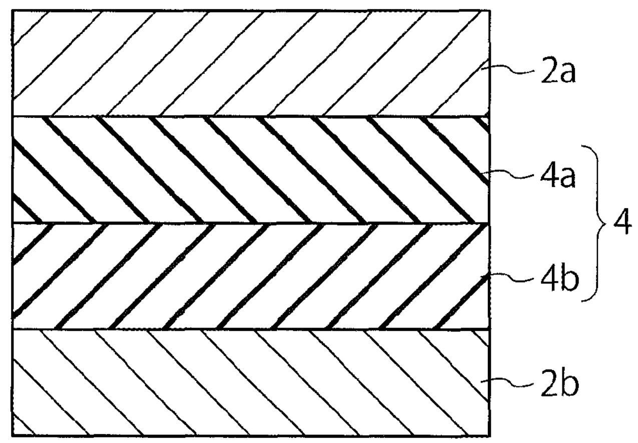
FIG. 2 is a cross-sectional view showing an example of a resistive change element of the first embodiment.
Figure 3A:
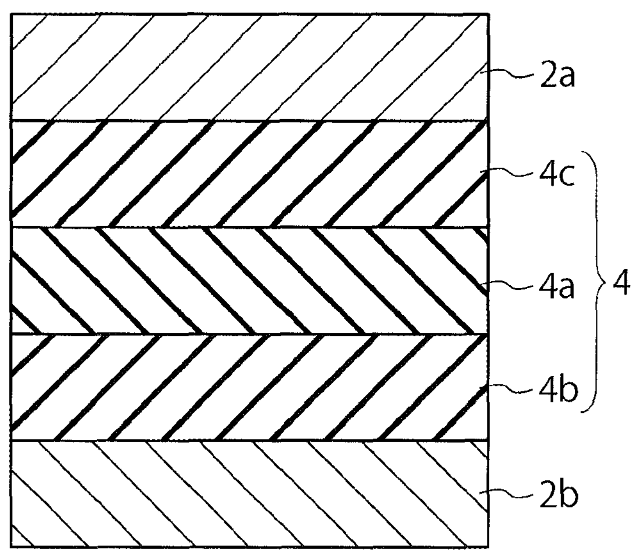
FIG. 3A is a cross-sectional view showing another example of the resistive change element of the first embodiment.
Figure 3B:
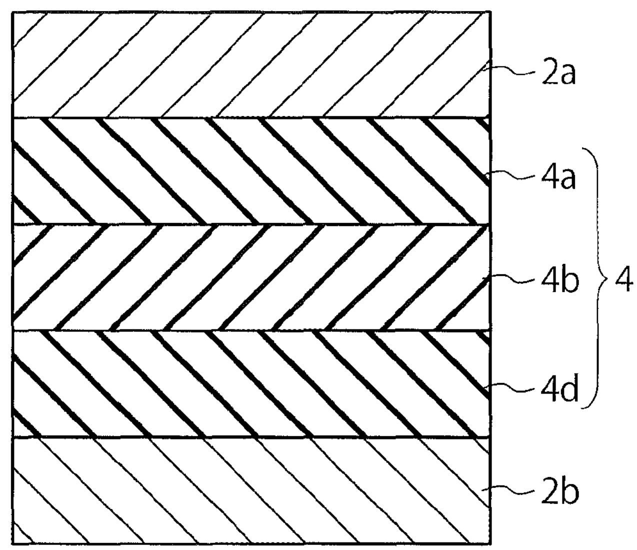
FIG. 3B is a cross-sectional view showing a further example of the resistive change element of the first embodiment.

FIG. 2 shows an example of a resistive change element included in the first embodiment. The resistive change element 2 includes an upper electrode 2*a*, a lower electrode 2*b*, and a resistive change layer 4 disposed between the upper electrode 2*a* and the lower electrode 2*b*. The upper electrode 2*a* contains nickel (Ni), and the lower electrode 2*b* contains titanium nitride (TiN). The resistive change layer 4 includes a layer 4*a* of hafnium oxynitride ($HfO_yN_z$ ($0<y\leq 2$, $0<z\leq 2$)), and a layer 4*b* of hafnium oxide ($HfO_x$ ($0<x\leq 2$)). In FIG. 2, the layer 4*a* of $HfO_yN_z$ ($0<y\leq 2$, $0<z\leq 2$) is disposed on the side of the upper electrode 2*a*, and the layer 4*b* of $HfO_x$ ($0<x\leq 2$) is disposed on the side of the lower electrode 2*b*. However, the locations of these layers may be reversed. Thus, the layer 4*a* of $HfO_yN_z$ ($0<y\leq 2$, $0<z\leq 2$) may be disposed on the side of the lower electrode 2*b*, and the layer 4*b* of $HfO_x$ ($0<x\leq 2$) may be disposed on the side of the upper electrode 2*a*. The resistive change element 2 may have a multilayer structure further including a layer 4*c* of $HfO_x$ ($0<x\leq 2$) between the layer 4*a* of $HfO_yN_z$ ($0<y\leq 2$, $0<z\leq 2$) and the upper electrode 2*a*, as shown in FIG. 3A, or a layer 4*d* of $HfO_yN_z$ ($0<y\leq 2$, $0<z\leq 2$) between the layer 4*b* of $HfO_x$ ($0<x\leq 2$) and the lower electrode 2*b*, as shown in FIG. 3B.

The resistive change element according to the first embodiment is a unipolar resistive change element. Therefore, the polarity of the voltage to be applied in setting a resistive change element is the same as the polarity of the voltage to be applied in resetting the resistive change element. For example, when the resistive change element according to the first embodiment is to be set, the voltage to be applied to the upper electrode 2*a* is greater than the voltage to be applied to the lower electrode 2*b*. Similarly, when the resistive change element is to be reset, the voltage to be applied to the upper electrode 2*a* is greater than the voltage to be applied to the lower electrode 2*b*.

Figure 4:
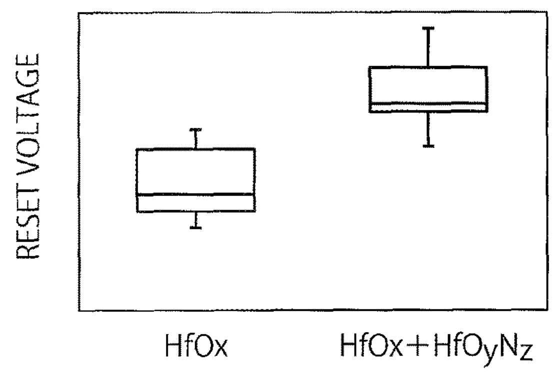
FIG. 4 is a diagram showing a result of measurements of reset voltages of the resistive change element of the first embodiment and the resistive change element of a comparative example.

If the resistive change layer 4 includes the layer 4*a* of $HfO_yN_z$ ($0<y\leq 2$, $0<z\leq 2$) as in the case of the resistive change element 2 according to the first embodiment, the reset voltage for resetting the resistive change element 2 may be caused to be higher than the resistive change element 2 without the layer 4*a*. This will be described with reference to FIG. 4. FIG. 4 shows a result of the measurements of reset voltages of a resistive change element (Comparative Example), in which the resistive change layer only includes a layer of $HfO_x$ ($0<x\leq 2$), and the resistive change element shown in FIG. 2, in which the resistive change layer 4 includes the layer 4*a* of $HfO_yN_z$ ($0<y\leq 2$, $0<z\leq 2$) and the layer 4*b* of $HfO_x$ ($0<x\leq 2$). As can be understood from FIG. 4, the reset voltage of the resistive change element 2 according to the first embodiment is higher than the reset voltage of the resistive change element of Comparative Example. A high reset voltage as in the resistive change element according to the first embodiment may prevent the resistive change element from being reset if, for example, a power supply voltage is applied to the resistive change element in a read operation. As a result, data written in the resistive change element may be prevented from being broken.

Figure 5:
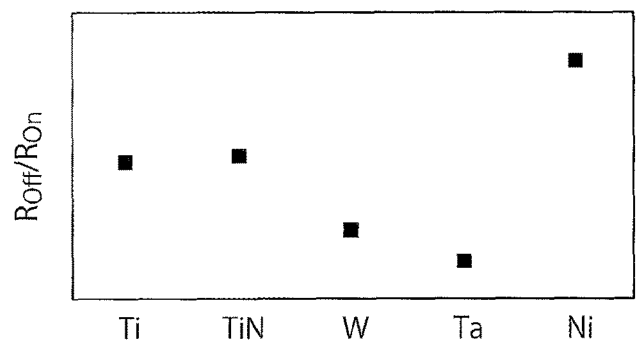
FIG. 5 is a diagram showing the ratio between ON resistance and OFF resistance of each of resistive change elements with different upper electrode materials.

FIG. 5 shows a result of the measurement of the ratio ($=R_{off}/R_{on}$) between OFF resistance $R_{off}$ and ON resistance $R_{on}$ of each of resistive change elements including, as the upper electrode 2*a* of the resistive change element 2 according to the first embodiment, a layers of nickel (Ni), titanium (Ti), titanium nitride (TiN), tungsten (W), and tantalum (Ta).

The lower electrode of each resistive change element contains TiN, like that of the first embodiment. As can be understood from FIG. 5, the ratio $R_{off}/R_{on}$ becomes the largest if Ni is used to form the upper electrode of the resistive change element. As will be described later, when a circuit is operating, signals are transmitted through an ON-state resistive change element. Therefore, the signal transmission speed may improve as the ON resistance $R_{on}$ becomes lower. Furthermore, when a circuit is operating, signals are cut off by OFF-state resistive change elements. Therefore, the leakage current may become lower and the power consumption may be suppressed if the OFF resistance $R_{off}$ becomes higher. For this reason, a higher ratio $R_{off}/R_{on}$ is preferable in the embodiments.

(Specific Example of Sub-Row Decoder)

Figure 6:
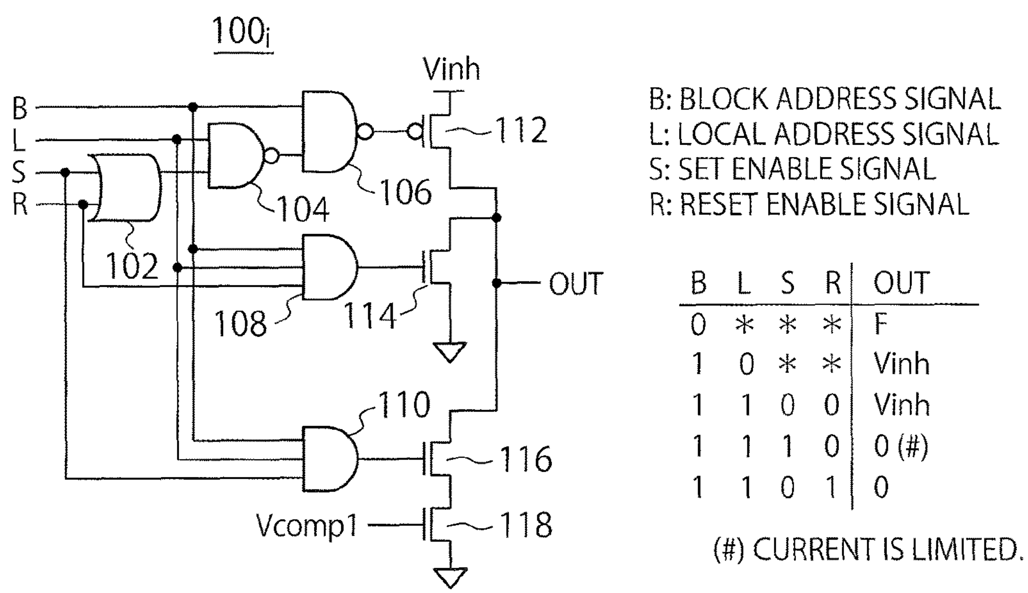
FIG. 6 is a circuit diagram showing a specific example of a sub-row decoder of the first embodiment.

The left side of FIG. 6 shows a specific example of the sub-row decoder 100$_i$ (i=1, . . . , m) according to the first embodiment.

A program voltage Vpgm is a voltage needed for setting or resetting the resistive change element. The program voltage Vpgm is typically about 3 V in a set operation, and about 2 V in a reset operation. A program inhibit voltage Vinh is a voltage between the program voltage Vpgm and a ground voltage (0 V). The value of the program inhibit voltage Vinh is preferably a half of the value of the program voltage Vpgm in the embodiments.

The sub-row decoder 100*i* of the specific example includes a OR gate 102, NAND gates 104 and 106, AND gates 108 and 110, a p-channel transistor 112, n-channel transistors 114 and 116, and an n-channel transistor 118 for current limitation.

The OR gate 102 performs a OR operation based on a set enable signal S and a reset enable signal R, and sends the operation result to the NAND gate 104. The NAND gate 104 performs a NAND operation based on a local address signal L for selecting a word line and the output from the OR gate 102, and sends the operation result to the NAND gate 106. The NAND gate 106 performs a NAND operation based on a block address signal B for selecting a block and the output from the NAND gate 104, and sends the operation result to the gate of the p-channel transistor 112. The AND gate 108 performs an AND operation based on the block address signal B, the local address signal L, and the reset enable signal R, and sends the operation result to the gate of the n-channel transistor 114. The AND gate 110 performs an AND operation based on the block address signal B, the local address signal L, and the set enable signal S, and sends the operation result to the gate of the n-channel transistor 116.

The program inhibit voltage Vinh is applied to the source of the p-channel transistor 112. The drain of the p-channel transistor 112 is connected to an output terminal OUT and the drain of the n-channel transistor 114. The program voltage Vpgm is needed to program, i.e., set, the resistive change element 2. The drain of the n-channel transistor 114 is connected to the output terminal OUT, and the source thereof is grounded. The drain of the n-channel transistor 116 is connected to the output terminal OUT, and the source thereof is connected to the drain of the n-channel transistor 118 for current limitation. The source of the n-channel transistor 118 for current limitation is grounded. A control voltage Vcomp1 is applied to the gate of the n-channel transistor 118 to turn ON the n-channel transistor 118.

The right side of FIG. 6 shows a logical operation table of the sub-row decoder 100$_i$ having this configuration. In this logical operation table, the asterisk (*) indicates any value, and the mark (#) indicates that the current flowing through the word line connected to the output terminal OUT is limited by the n-channel transistor 118 for current limitation. For example, if the value of the block address signal B is "0", the p-channel transistor 112 is turned OFF regardless of which value ("0" or "1") each of the local address signal L, the set enable signal S, and the reset enable signal R has. Therefore, the potential of the output terminal OUT is shown as F, which represents a floating state.

If the value of the block address signal B is "1" and the value of the local address signal L is "0", the p-channel transistor 112 is turned ON and the n-channel transistor 114 and the n-channel transistor 116 are turned OFF regardless of the value ("0" or "1") of the set enable signal S and the reset enable signal R. Accordingly, the potential of the output terminal OUT is at the program inhibit voltage Vinh.

If the value of the block address signal B is "1", the value of the local address signal L is "1," the value of the set enable signal S is "0", and the value of the reset enable signal R is "0", the p-channel transistor 112 is turned ON and the n-channel transistor 114 and the n-channel transistor 116 are turned OFF. Accordingly, the potential of the output terminal OUT is at the program inhibit voltage Vinh.

If the value of the block address signal B is "1", the value of the local address signal L is "1", the value of the set enable signal S is "1", and the value of the reset enable signal R is "0", the p-channel transistor 112 and the n-channel transistor 114 are turned OFF, and the n-channel transistor 116 is turned ON. Accordingly, the potential of the output terminal OUT is at 0. The n-channel transistor 118 limits the current flowing through the word line connected to the output terminal OUT.

If the value of the block address signal B is "1", the value of the local address signal L is "1," the value of the set enable signal S is "0", and the value of the reset enable signal R is "1", the p-channel transistor 112 is turned OFF, the n-channel transistor 114 is turned ON, and the n-channel transistor 116 is turned OFF. Accordingly, the potential of the output terminal OUT is at 0.

(Specific Example of Sub-Column Decoder)

Figure 7:
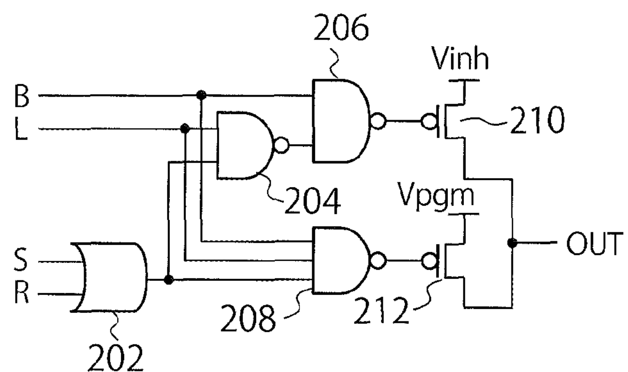
FIG. 7 is a circuit diagram showing a specific example of a sub-column decoder of the first embodiment.

The left side of FIG. 7 shows a specific example of a sub-column decoder 200$_j$ (j=1, 2) according to the first embodiment. The sub-column decoder 200$_j$ includes a OR gate 202, NAND gates 204, 206, and 208, and p-channel transistors 210 and 212.

The OR gate 202 performs a OR operation based on a set enable signal S and a reset enable signal R, and sends the operation result to the NAND gate 204 and the NAND gate 208. The NAND gate 204 performs a NAND operation based on a local address signal L and the output from the OR gate 202, and sends the operation result to the NAND gate 206. The NAND gate 206 performs a NAND operation based on a block address signal B and the output from the NAND gate 204, and sends the operation result to the gate of the p-channel transistor 210.

The NAND gate 208 performs a NAND operation based on the block address signal B, the local address signal L, and the output from the OR gate 202, and sends the operation result to the gate of the p-channel transistor 212.

A program inhibit voltage Vinh is applied to the source of the p-channel transistor 210. The drain of the p-channel transistor 210 is connected to an output terminal OUT. A program voltage Vpgm is applied to the source of the p-channel transistor 212. The drain of the p-channel transistor 212 is connected to the output terminal OUT.

The right side of FIG. 7 shows a logical operation table of the sub-column decoder 200$_j$ having this configuration. In this logical operation table, the asterisk (*) indicates any value. For example, if the value of the block address signal B is "0", the p-channel transistors 210 and 212 are turned OFF regardless of which value ("0" or "1") each of the local address signal L, the set enable signal S, and the reset enable signal R has. The potential of the output terminal OUT is shown as F, which represents a floating state.

If the value of the block address signal B is "1" and the value of the local address signal L is "0", the p-channel transistor 210 is turned ON and the p-channel transistor 212 is turned OFF regardless of the value ("0" or "1") of the set enable signal S and the reset enable signal R. Accordingly the potential of the output terminal OUT is at the program inhibit voltage Vinh.

If the value of the block address signal B is "1", the value of the local address signal L is "1", the value of the set enable signal S is "0", and the value of the reset enable signal R is "0", the p-channel transistor 210 is turned ON and the p-channel transistor 212 is turned OFF. Accordingly, the potential of the output terminal OUT is at the program inhibit voltage Vinh.

If the value of the block address signal B is "1", the value of the local address signal L is "1", the value of the set enable signal S is "1", and the value of the reset enable signal R is "0", the p-channel transistor 210 is turned OFF and the p-channel transistor 212 is turned ON. Accordingly, the potential of the output terminal OUT is at the program voltage Vpgm.

If the value of the block address signal B is "1", the value of the local address signal L is "1", the value of the set enable signal S is "0", and the value of the reset enable signal R is "1", the p-channel transistor 210 is turned OFF and the p-channel transistor 212 is turned ON. Accordingly, the potential of the output terminal OUT is at the program voltage Vpgm.

The specific example of the sub-row decoder includes the n-channel transistor 114 of which the drain is connected to the output terminal OUT, and the source is grounded. The specific example of the sub-column decoder includes the p-channel transistor 212 of which the drain is connected to the output terminal OUT and the source is connected to a power supply generating the program voltage Vpgm. Driving the n-channel transistor 114 requires substantially the same driving performance as driving the p-channel transistor 212. However, if they requires about the same driving performance, the size of the n-channel transistor is smaller than the size of the p-channel transistor. Since the number of sub-row decoders is greater than the number of sub-column decoders in the first embodiment, the entire area of the look-up table circuit may be reduced if it is the drain of n-channel transistor that is to be connected to the output terminal OUT of each sub-row decoder.

(Further Specific Example of Sub-Row Decoder)

Figure 8:
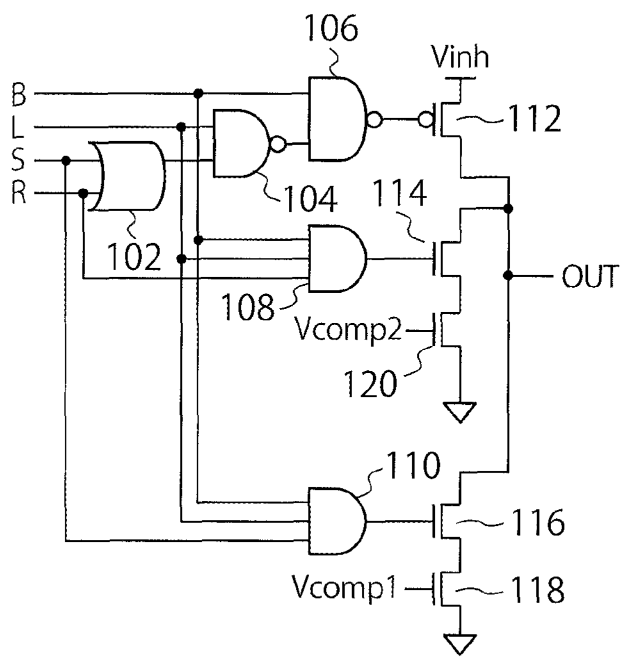
FIG. 8 is a circuit diagram showing another specific example of the sub-row decoder of the first embodiment.

The left side of FIG. 8 shows a further specific example of the sub-row decoder $\mathbf{100}_i$ (i=1, . . . , m) according to the first embodiment. The sub-row decoder $\mathbf{100}_i$ is obtained by adding, to the sub-row decoder $\mathbf{100}_i$ shown in the left side of FIG. 6, an n-channel transistor 120 for current limitation between the n-channel transistor 114 and the ground.

The drain of the n-channel transistor 120 for current limitation is connected to the source of the n-channel transistor 114, and the source thereof is grounded. A control voltage Vcomp2 is applied to the gate of the n-channel transistor 120 for current limitation to turn it ON. The control voltage Vcomp2 is preferably higher than the control voltage Vcomp1 applied to the gate of the n-channel transistor 118 for current limitation in this embodiment. The n-channel transistor 120 for current limitation may be removed, if necessary, to have a sufficient reset current. The circuit without the n-channel transistor 120 is the same as the sub-row decoder $\mathbf{100}_i$ (i=1, . . . , m) of the specific example shown in the left side of FIG. 6.

The right side of FIG. 8 shows a logical operation table of the sub-row decoder $\mathbf{100}_i$ of the further specific example. The logical operation table of FIG. 8 is the same as the logical operation table shown in FIG. 6.

(Program Method)

Figure 9:
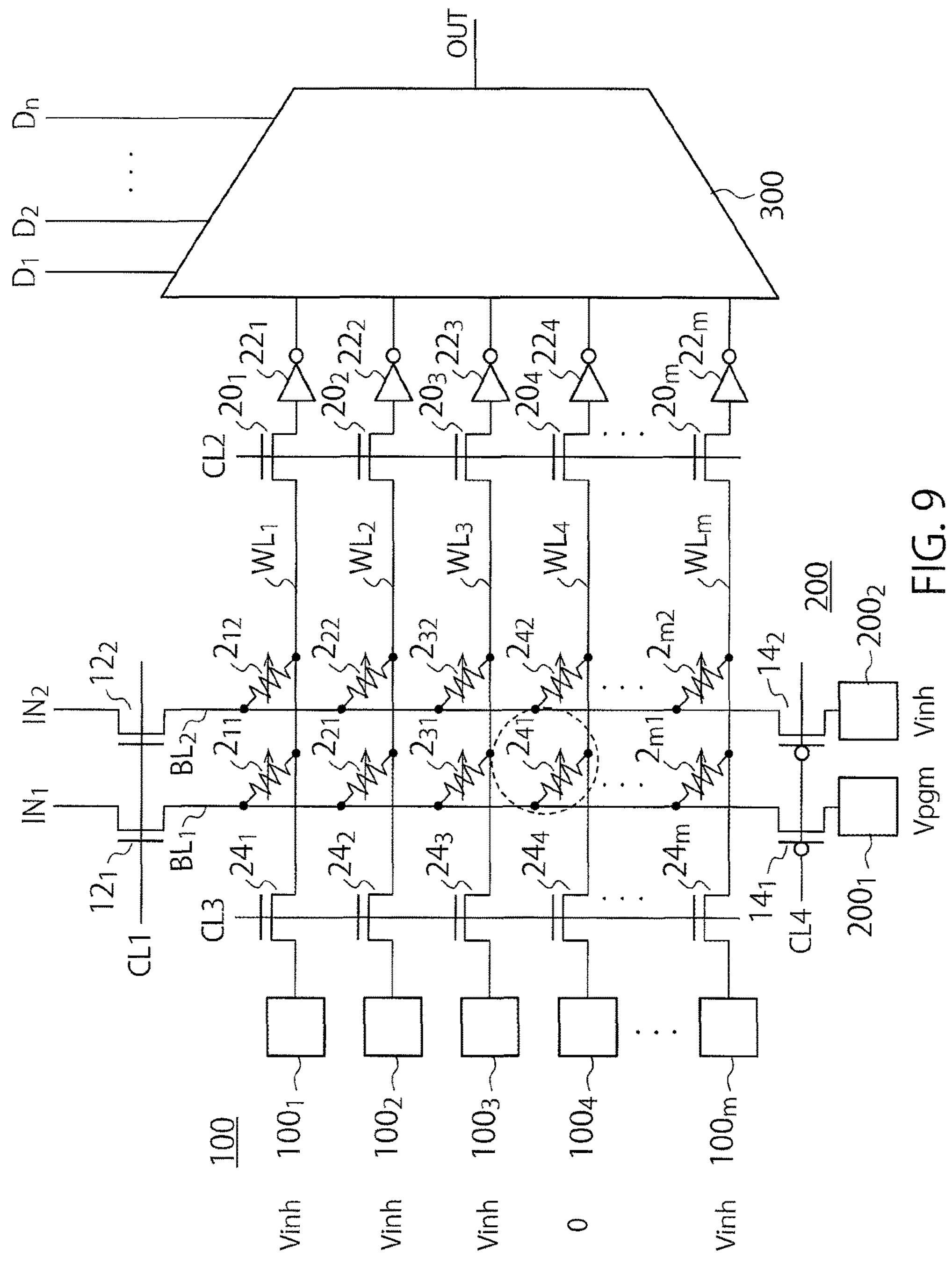
FIG. 9 is an explanatory diagram illustrating a write method for the look-up table circuit according to the first embodiment.

A method of programming a selected memory cell, i.e., resistive change element, of the look-up table circuit according to the first embodiment will be described with reference to FIG. 9. FIG. 9 is an explanatory diagram illustrating the programming of the resistive change element $\mathbf{2}_{41}$ by changing (setting) the state of the resistive change element $\mathbf{2}_{41}$ from the HRS to the LRS. The resistive change element $\mathbf{2}_{41}$ to be programmed is circled by a broken line in FIG. 9.

First, the block including the resistive change element to be programmed is selected. For example, the value of the block address signal B shown in FIGS. 6 to 8 is set at "1" in the block to be selected, and at "0" in the blocks that are not to be selected. The transistors $\mathbf{12}_1$ and $\mathbf{12}_2$ and the transistors $\mathbf{20}_1$ to $\mathbf{20}_m$ are turned OFF and the transistors $\mathbf{14}_1$ and $\mathbf{14}_2$ and the transistors $\mathbf{24}_1$ to $\mathbf{24}_m$ are also turned ON in the selected block.

Thereafter, with respect to the word line to be selected, for example the word line $WL_4$, the value of the local address signal L is set at "1", the value of the set enable signal S is set at "1", and the value of the reset enable signal R is set at "0". With respect to the non-selected word lines $WL_i$ ($i \neq 4$), the value of the local address signal L is set at "0", the value of the set enable signal S is set at "0", and the value of the reset enable signal R is set at "0". As a result, a voltage 0 V is applied to the selected word line $WL_4$ by the sub-column decoder $\mathbf{100}_4$, and a program inhibit voltage Vinh is applied to the non-selected word lines $WL_i$ ($i \neq 4$) by the sub-column decoder $\mathbf{100}_i$ (FIG. 9) in accordance with the logical operation table shown in the right side of FIG. 6.

Simultaneously, with respect to the bit line to be selected, for example the bit line $BL_1$, the value of the local address signal L is set at "1", the value of the set enable signal S is set at "1", and the value of the reset enable signal R is set at "0". With respect to the non-selected bit line $BL_2$, the value of the local address signal L is set at "0", the value of the set enable signal S is set at "0", and the value of the reset enable signal R is set at "0". As a result, a program voltage Vpgm is applied to the selected bit line $BL_1$ by the sub-column decoder $\mathbf{200}_1$, and the program inhibit voltage Vinh is applied to the non-selected bit line $BL_2$ by the sub-column decoder $\mathbf{200}_2$ (see FIG. 9) in accordance with the logical operation table shown in the right side of FIG. 7.

Thus, the program voltage Vpgm is applied between the terminals of the selected resistive change element in the selected block, and the program inhibit voltage Vinh or 0 V is applied between the terminals of the non-selected resistive change elements. The selected resistive change element of the selected block is programmed in this manner.

In the above descriptions, 0 V is applied to the selected word line, the voltage Vinh is applied to the non-selected word lines, the voltage Vpgm is applied to the selected bit line, and the voltage Vinh is applied to the non-selected bit lines in the set operation. Alternatively, the voltage Vinh may be applied to all the word lines and all the bit lines to precharge them, and then 0 V may be applied to the selected word line and the voltage Vpgm may be applied to the selected bit line in a set operation. This is more preferable in one or more embodiments since even if the voltage are not applied to the respective resistive change elements at the same time, the potential difference between the terminals of the non-selected resistive change elements may be suppressed equal to or less than Vinh. Therefore, the non-selected resistive change elements may be prevented from being programmed in error.

A device for preventing an excessive current from flowing between the terminals of a resistive change element when the state of the resistive change element is changed from the HRS to the LRS is preferably included in one or more embodiments.

When the resistive change element is in the HRS, the set voltage applied between the terminals of the resistive change element would not lead to a large current. However, after the state of the resistive change element is changed to the LRS, a large current may be caused to flow. A too large current may lead to variations in resistance value of the resistive change element after the set operation. In order to suppress the overcurrent, the sub-row decoder $\mathbf{100}_i$ (i=1, . . . , m) includes a transistor 118 for current limitation in the first embodiment.

The sub-column decoder $\mathbf{200}_j$ does not include any transistor for current limitation in the first embodiment. However, the overcurrent between the terminals of the resistive change element in a set operation may also be prevented if the sub-column decoder $\mathbf{200}_j$ shown in FIG. 7 includes a transistor for current limitation between the source of the p-channel transistor 212 and the voltage source of the voltage Vpgm, instead of the transistor 118 for current limitation included in the sub-row decoder $\mathbf{100}_i$. However, the transistor for current limitation is disposed to the sub-row decoder instead of the sub-column decoder in the first embodiment for the following reason.

In the look-up table circuit of the first embodiment, the resistive change elements connected to the same word line are not set in the LRS simultaneously. However, the resistive change elements connected to the same bit line may be set in the LRS simultaneously. For example, two resistive change elements $\mathbf{2}_{11}$ and $\mathbf{2}_{12}$ connected to the word line $WL_1$ in FIG. 9 are not set in the LRS simultaneously, but two resistive change elements $\mathbf{2}_{11}$ and $\mathbf{2}_{41}$ connected to the bit line $BL_1$ may be set in the LRS simultaneously. Therefore, when the state of the resistive change element $\mathbf{2}_{41}$ is changed from the HRS to the LRS, the state of the resistive change element $\mathbf{2}_{11}$ may be the HRS or the LRS. As shown in FIG. 9, when the state of the resistive change element $\mathbf{2}_{41}$ is changed from the HRS to the LRS, the voltage 0 V is applied to the word line $WL_4$ by the sub-row decoder $\mathbf{100}_4$, the voltage Vinh is applied to the word line $WL_1$ by the sub-row decoder $\mathbf{100}_1$, the voltage Vpgm is applied to the bit line $BL_1$ by the sub-column decoder $\mathbf{200}_1$, and the voltage Vinh is applied to the bit line $BL_2$ by the sub-column decoder $\mathbf{200}_2$. If the state of the resistive change element $\mathbf{2}_{11}$ is the LRS, the voltage Vinh applied to the word line $WL_1$ by the sub-row decoder $\mathbf{100}_1$ is also applied to the bit line $BL_1$ via the resistive change element $\mathbf{2}_{11}$ that is in the LRS. Therefore, the voltage Vpgm is applied to the bit line $BL_1$ by the sub-column decoder $\mathbf{200}_1$, and the voltage Vinh is also applied thereto by the sub-row decoder $\mathbf{100}_1$ through the resistive change element $\mathbf{2}_{11}$. This makes the potential of the bit line $BL_1$ unstable. If the sub-row decoder $\mathbf{100}_1$ includes the transistor 118 for current limitation, the voltage Vinh applied to the bit line $BL_1$ by the sub-row decoder $\mathbf{100}_1$ may be lowered by the transistor 118 for current limitation. Therefore, the potential of the bit line $BL_1$ may be set at Vpgm, and the correct set voltage may be applied between the terminals of the resistive change element $\mathbf{2}_{41}$. If, however, the sub-column decoder $\mathbf{200}_1$ includes the transistor for current limitation, the voltage Vpgm to be applied to the bit line $BL_1$ by the sub-column decoder $\mathbf{200}_1$ may be lowered by the transistor for current limitation. Therefore, the potential of the bit line $BL_1$ may be set at Vinh, and an incorrect set voltage may be applied between the terminals of the resistive change element $\mathbf{2}_{41}$. For the above reason, the transistor for current limitation is disposed to the sub-row decoder instead of the sub-column decoder in the first embodiment.

The selected resistive change element in the selected block is reset by setting the value of the set enable signal S at "0" and the value of the reset enable signal R at "1" with respect to the selected resistive change element, and setting the value of the set enable signal S at "0" and the value of the reset enable signal R at "0" with respect to the non-selected resistive change elements. As a result, the voltage 0 V is applied to the word line, to which the selected resistive change element is connected, by the sub-row decoder, and a reset voltage Vpgm is applied to the bit line, to which the selected resistive change element is connected, by the sub-column decoder (see FIGS. 6 and 7). As a result, the reset voltage Vpgm is applied between the terminals of the selected resistive change element. The voltage Vinh is applied to the word lines and the bit line to which the non-selected resistive change elements are connected. As a result, the voltage Vinh or 0 V is applied between the terminals of each of the non-selected resistive change elements. The selected resistive change element in the selected block can be reset in this manner.

The transistor $\mathbf{12}_j$ (j=1, 2) is disposed to interrupt the voltage for programming the resistive change element $\mathbf{2}_{ij}$ (i=1, . . . , m, j=1, 2) from the input line $IN_j$, and thus is turned OFF while the resistive change element $\mathbf{2}_{ij}$ is being programmed (set or reset). Although the transistor $\mathbf{12}_j$ (j=1, 2) is an n-channel transistor in FIG. 1, a p-channel transistor may also be used.

The transistor $\mathbf{20}_i$ (i=1, . . . , m) is disposed to interrupt the voltage for programming the resistive change element $\mathbf{2}_{ij}$ (i=1, . . . , m, j=1, 2) from the inverter $\mathbf{22}_i$, and thus is turned OFF while the resistive change element $\mathbf{2}_{ij}$ is being programmed (set or reset). If the program voltage for programming the resistive change element is low, the transistor $\mathbf{20}_i$ (j=1, . . . , m) may not be needed. Although the transistor $\mathbf{20}_i$ (j=1, . . . , m) is an n-channel transistor in FIG. 1, a p-channel transistor may also be used.

(Operation of Look-Up Table Circuit)

Figure 10:
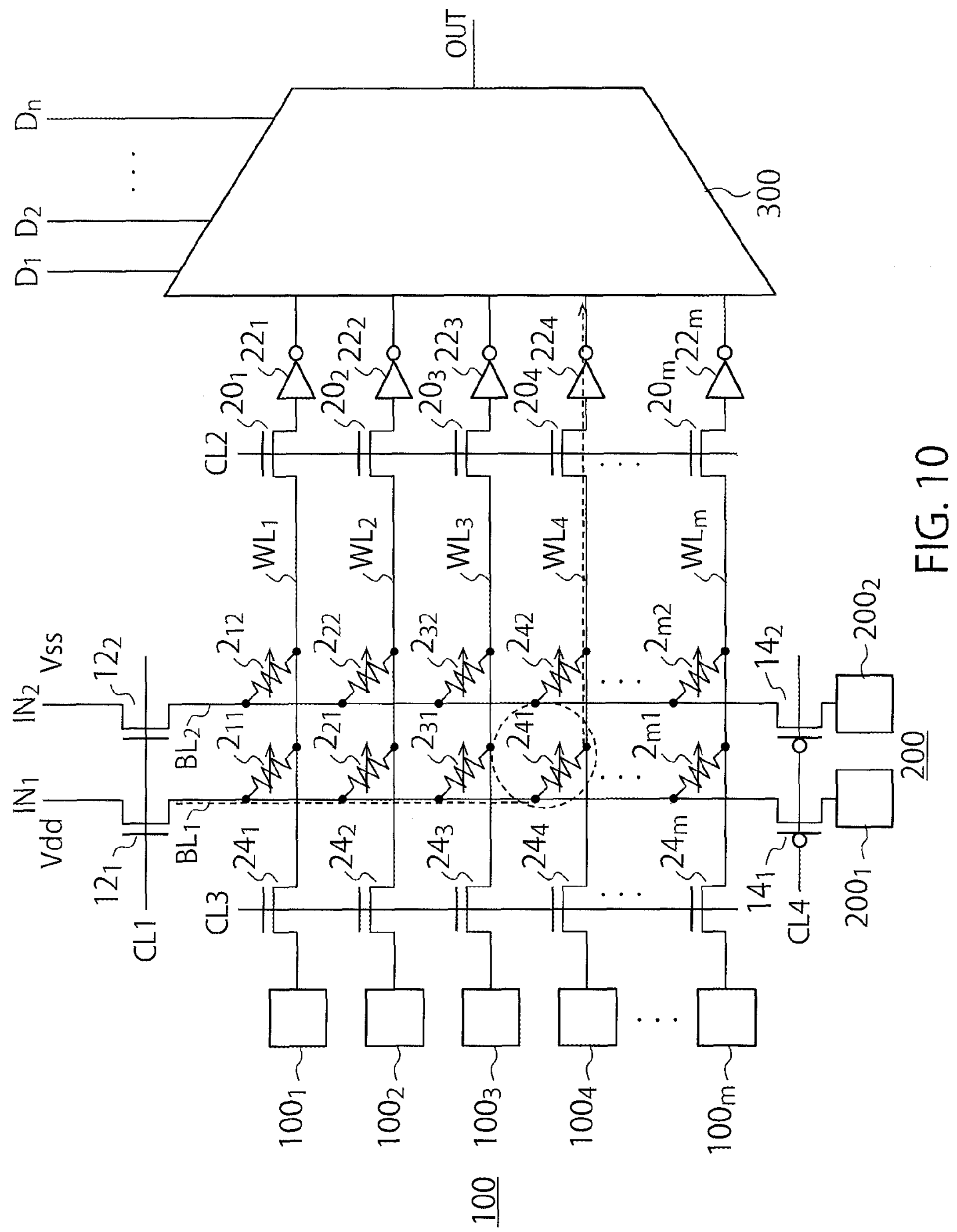
FIG. 10 is an explanatory diagram illustrating an operation of the look-up table circuit according to the first embodiment.

The operation of the look-up table circuit according to the first embodiment will be described below with reference to FIG. 10.

The resistive change elements $\mathbf{2}_{i1}$, and $\mathbf{2}_{i2}$ (i=1, . . . , m) are programmed such that one is in the HRS and the other is in the LRS. If the resistive change element $\mathbf{2}_{11}$ is in the LRS, the resistive change element $\mathbf{2}_{12}$ is in the HRS. Thus, they are not in the LRS at the same time.

First, the transistors $\mathbf{12}_1$, $\mathbf{12}_2$ and $\mathbf{20}_1$ to $\mathbf{20}_m$ are turned ON, and the transistors $\mathbf{14}_1$, $\mathbf{14}_2$ and $\mathbf{24}_1$ to $\mathbf{24}_m$ are turned OFF.

Thereafter, one of the bit lines $BL_1$ and $BL_2$, for example the bit line $BL_1$, is selected. A drive voltage Vdd is applied to the input line $IN_1$ connecting to the selected bit line $BL_1$, and a ground voltage Vss is applied to the input line $IN_2$ connecting to the non-selected bit line $BL_2$. As a result, the drive voltage Vdd may be applied to the selected bit line $BL_1$, and a potential corresponding to the resistance value of the resistive change element $\mathbf{2}_{i1}$ (i=1, . . . , m) connected to the bit line $BL_1$ may appear on the word line $WL_i$. For example, if the resistive change element $\mathbf{2}_{41}$ circled by a broken line is in the LRS, the voltage Vdd appears on the word line $WL_4$. If the resistive change element $\mathbf{2}_{41}$ is in the HRS, the voltage Vss appears on the word line $WL_4$ through the resistive change element $\mathbf{2}_{42}$.

The potential appearing on the word line $WL_i$ (i=1, . . . , m) is conveyed to the multiplexer 300 via the transistor $\mathbf{20}_i$ and the inverter $\mathbf{22}_i$. The multiplexer 300 selects one of the outputs of the m inverters $\mathbf{22}_1$ to $\mathbf{22}_m$ based on the signal values of the control lines $D_1$-$D_n$.

Figure 11:
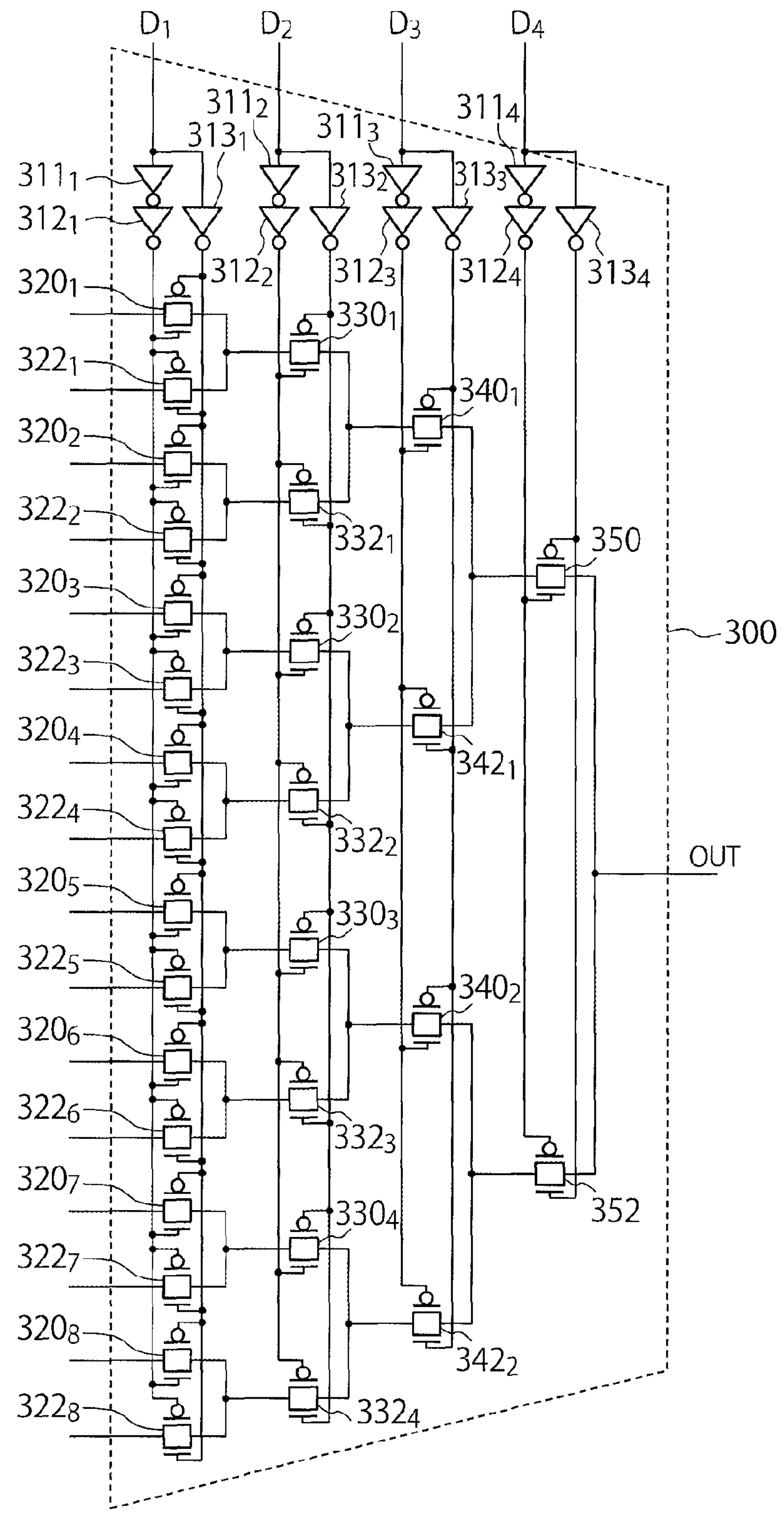
FIG. 11 is a circuit diagram showing a specific example of a multiplexer of the first embodiment.

FIG. 11 shows a specific example of a circuit configuration of the multiplexer 300. The multiplexer 300 of this specific example is for 16 rows, i.e., 16 word lines, and selects one of the outputs of 16 inverters $\mathbf{22}_1$ to $\mathbf{22}_{16}$ based on the signal values of four control lines $D_1$, $D_2$, $D_3$, and $D_4$.

The multiplexer 300 includes inverters $\mathbf{311}_k$, $\mathbf{312}_k$, and $\mathbf{313}_k$ disposed to each control line $D_k$ (k=1, . . . , 4), transfer gates $\mathbf{320}_1$ to $\mathbf{320}_8$ and $\mathbf{322}_1$ to $\mathbf{322}_8$, transfer gates $\mathbf{330}_1$ to $\mathbf{330}_4$ and $\mathbf{332}_1$ to $\mathbf{332}_4$, transfer gates $\mathbf{340}_1$ and $\mathbf{340}_2$ and $\mathbf{342}_1$ and $\mathbf{342}_2$, and transfer gates 350 and 352. Each transfer gate includes a p-channel transistor and an n-channel transistor of which the sources are connected to each other and the drains are connected to each other.

The inverters $\mathbf{311}_k$ and $\mathbf{312}_k$ (k=1, . . . , 4) corresponding to the control line $D_k$ are connected in series with each other, and the inverter $\mathbf{311}_k$ receives signals from the control line $D_k$. The inverter $\mathbf{313}_k$ (k=1, . . . , 4) receives signals from the control line $D_k$.

The input terminal of the transfer gate $\mathbf{320}_i$ (i=1, . . . , 8) is connected to the output terminal of the inverter $\mathbf{22}_{2i-1}$, the gate of the p-channel transistor is connected to the output terminal of the inverter $\mathbf{313}_1$, and the gate of the n-channel transistor is connected to the output terminal of the inverter $\mathbf{312}_1$. The input terminal of the transfer gate $\mathbf{322}_i$ (i=1, . . . , 8) is connected to the output terminal of the inverter $\mathbf{22}_{2i}$, the gate of the p-channel transistor is connected to the output terminal of the inverter $\mathbf{312}_1$, and the gate of the n-channel transistor is connected to the output terminal of the inverter $\mathbf{313}_1$.

The input terminal of the transfer gate $\mathbf{330}_i$ (i=1, . . . , 4) is connected to the output terminal of the transfer gate $\mathbf{320}_{2i-1}$ and the output terminal of the transfer gate $\mathbf{322}_{2i-1}$, the gate of the p-channel transistor is connected to the output terminal of the inverter $\mathbf{313}_2$, and the gate of the n-channel transistor is connected to the output terminal of the inverter $\mathbf{312}_2$. The input terminal of the transfer gate $\mathbf{332}_i$ (i=1, . . . , 4) is connected to the output terminal of the transfer gate $\mathbf{320}_{2i}$ and the output terminal of the transfer gate $\mathbf{322}_{2i}$, the gate of the p-channel transistor is connected to the output terminal of the inverter $\mathbf{312}_2$, and the gate of the n-channel transistor is connected to the output terminal of the inverter $\mathbf{313}_2$.

The input terminal of the transfer gate $\mathbf{340}_i$ (i=1, 2) is connected to the output terminal of the transfer gate $\mathbf{330}_{2i-1}$ and the output terminal of the transfer gate $\mathbf{332}_{2i-1}$, the gate of the p-channel transistor is connected to the output terminal of the inverter $\mathbf{313}_3$, and the gate of the n-channel transistor is connected to the output terminal of the inverter $\mathbf{312}_3$. The input terminal of the transfer gate $\mathbf{342}_i$ (i=1, 2) is connected to the output terminal of the transfer gate $\mathbf{330}_{2i}$ and the output terminal of the transfer gate $\mathbf{332}_{2i}$, the gate of the p-channel transistor is connected to the output terminal of the inverter $\mathbf{312}_3$, and the gate of the n-channel transistor is connected to the output terminal of the inverter $\mathbf{313}_3$.

The input terminal of the transfer gate 350 is connected to the output terminal of the transfer gate $\mathbf{340}_1$ and the output terminal of the transfer gate $\mathbf{342}_1$, the gate of the p-channel transistor is connected to the output terminal of the inverter $\mathbf{313}_4$, and the gate of the n-channel transistor is connected to the output terminal of the inverter $\mathbf{312}_4$. The input terminal of the transfer gate 352 is connected to the output terminal of the transfer gate $\mathbf{340}_2$ and the output terminal of the transfer gate $\mathbf{342}_2$, the gate of the p-channel transistor is connected to the output terminal of the inverter $\mathbf{312}_4$, and the gate of the n-channel transistor is connected to the output terminal of the inverter $\mathbf{313}_4$. The output terminal of the transfer gate 350 and the output terminal of the transfer gate 352 are connected to the output terminal OUT of the multiplexer 300.

The multiplexer 300 with this configuration selects one of the outputs of the 16 inverters $\mathbf{22}_1$ to $\mathbf{22}_{16}$ based on the signal values of the four control lines $D_1$, $D_2$, $D_3$, and $D_4$.

As described above, the look-up table circuit according to the first embodiment includes nonvolatile resistive change elements as memory cells, which may be highly integrated.

Although the number of bit lines in the first embodiment is two, the number may be three or more.

(Second Embodiment)

Figure 12:
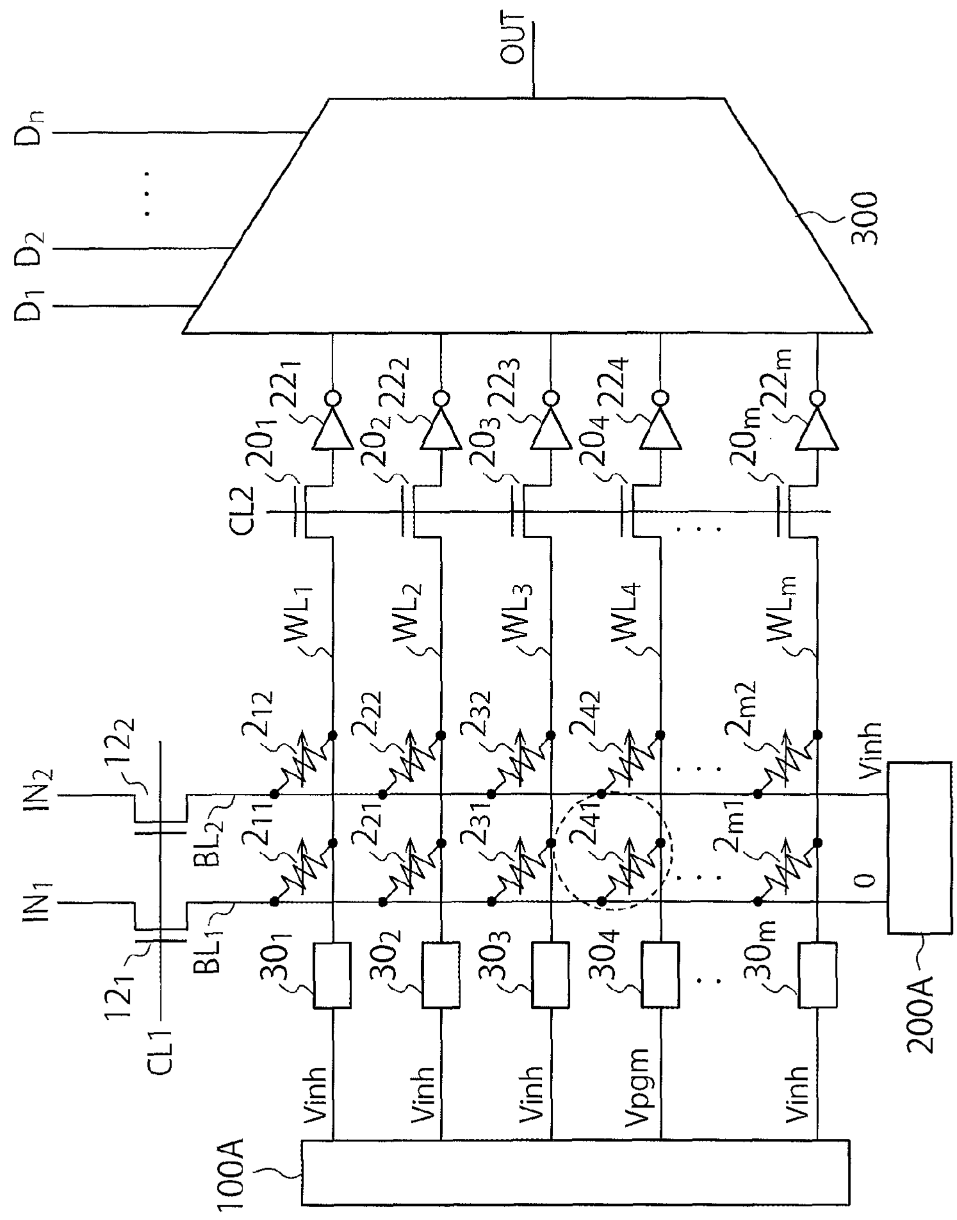
FIG. 12 is a diagram illustrating a look-up table circuit according to a second embodiment and a program method therefor.

FIG. 12 shows a look-up table circuit according to a second embodiment. The look-up table circuit according to the second embodiment is obtained by eliminating the transistors $\mathbf{14}_1$ and $\mathbf{14}_2$ and the transistors $\mathbf{24}_1$ to $\mathbf{24}_m$, replacing the row decoder 100 with a row decoder (row controller) 100A, replacing the column decoder 200 with a column decoder (column controller) 200A, and newly adding current limitation circuits $\mathbf{30}_1$ to $\mathbf{30}_m$ in the look-up table circuit according to the first embodiment shown in FIG. 1. The row decoder 100A controls voltages to be applied to a plurality of word lines, and the column decoder 200A controls voltages to be applied to a plurality of bit lines. The current limitation circuit $\mathbf{30}_i$ (i=1, . . . , m) corresponds to, and is connected to, the word line $WL_i$. In FIG. 12, the current limitation circuit $\mathbf{30}_i$ (i=1, . . . , m) is disposed between the corresponding word line $WL_i$ and the row decoder 100A. However, the current limitation circuit $\mathbf{30}_i$ (i=1, . . . , m) may be disposed on the opposite side of the row decoder 100A from the word line $WL_i$.

A method of setting a selected resistive change element, for example the resistive change element $\mathbf{2}_{41}$ circled by a broken line in FIG. 12, in the look-up table circuit according to the second embodiment will be described below.

First, the block including the resistive change element to be programmed is selected. In the selected block, the transistors $\mathbf{20}_1$ to $\mathbf{20}_m$ are turned OFF, and the transistors $\mathbf{12}_1$ and $\mathbf{12}_2$ are turned OFF. Thereafter, a program voltage Vpgm is applied to the selected word line $WL_4$ by the row decoder 100A, and a program inhibit voltage Vinh is applied to the non-selected word lines $WL_1$ to $WL_3$ and $WL_5$ to $WL_m$. Furthermore, a voltage 0 V is applied to the selected bit line $BL_1$ by the column decoder 200A, and the program inhibit voltage Vinh is applied to the non-selected bit line $BL_2$. The current limitation circuit $\mathbf{30}_4$ limits the current caused to flow through the resistive change element $\mathbf{2}_{41}$ from the selected word line $WL_4$ to be equal to or less than a predetermined value.

As a result, the program voltage Vpgm is applied between the terminals of the selected resistive change element of the selected block, and the program inhibit voltage Vinh or the voltage 0 V is applied between the terminals of the non-selected resistive change elements. The selected resistive change element in the selected block may be programmed in this manner.

In the above descriptions, first the program voltage Vpgm is applied to the selected word line, the voltage inhibit Vinh is applied to the non-selected word lines, the voltage 0 V is applied to the selected bit line, and the program inhibit voltage Vinh is applied to the non-selected bit lines in the set operation. In one or more embodiments, it is preferable that the program inhibit voltage Vinh is applied to all the word lines and all the bit lines to pre-charge them, and then the program Vpgm is applied to the selected word line and the voltage 0 V is applied to the selected bit line. This method may prevent the erroneous programming of a non-selected resistive change element even if the voltages are not applied to the resistive change elements at the same time since the potential difference between the terminals of each non-selected resistive change element may be suppressed to be equal to or less than Vinh.

A reset operation will be described below. First, the transistors $\mathbf{20}_1$ to $\mathbf{20}_m$ and the transistors $\mathbf{12}_1$ and $\mathbf{12}_2$ are turned OFF in the selected block. Thereafter, a voltage Vpgm is applied to the selected word line $WL_4$ by the row decoder 100A, and a voltage Vinh is applied to the non-selected word lines $WL_1$ to $WL_3$ and $WL_5$ to $WL_m$ by the column decoder 200A. Furthermore, a voltage 0 V is applied to the selected bit line $BL_1$ by the column decoder 200A, and the voltage Vinh is applied to the non-selected bit line $BL_2$. The current limitation circuit $\mathbf{30}_4$ connected to the selected word line $WL_4$ causes the current flowing through the resistive change element $\mathbf{2}_{41}$ to be higher than the current in the set operation, and lower than the overcurrent value.

As a result, the reset voltage Vpgm is applied between the terminals of the selected resistive change element of the selected block, and the voltage Vinh or 0 V is applied between the terminals of the non-selected resistive change elements. This resets the selected resistive change element in the selected block.

(Current Limitation Circuit)

Figure 13A:
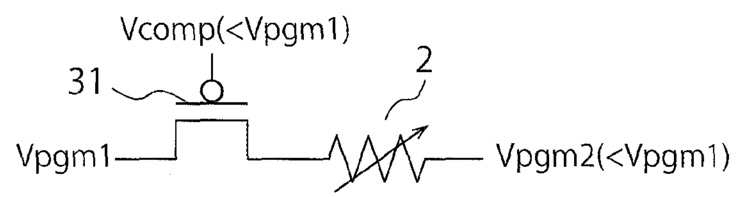
FIG. 13A is a circuit diagram showing a specific example of a current limitation circuit.
Figure 13B:
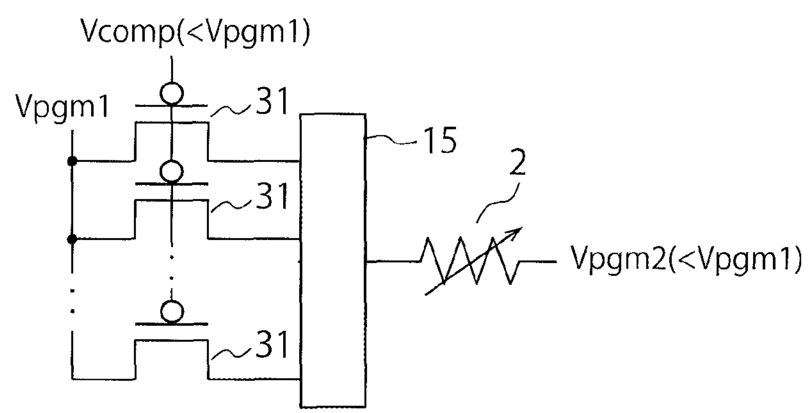
FIG. 13B is a circuit diagram showing another specific example of the current limitation circuit.

When a set voltage or reset voltage is applied to the resistive change element, a device for limiting the current flowing through the resistive change element to be equal to or less than a predetermined value ("limited current value") may be provided to suppress variations in resistance of the resistive change element or to prevent irreversible breakdown of the resistive change element. Generally, if the limited current value in a set operation increases, the resistance of the resistive change element after the set operation decreases. In a reset operation, the limited current value should be sufficiently large to cause a sufficient amount of current to flow through the resistive change element in order to generate heat that changes the resistive state of the resistive change element to a high-resistance state. As described above, different limited current values are used in the set operation and the reset operation FIGS. 13A, 13B show examples of a current limitation circuit for generating a limited current value. The maximum current flowing through the resistive change element 2 may be controlled by a voltage Vcomp applied to the gate of a p-channel transistor 31 connected in series to the resistive change element 2. In the example shown in FIG. 13A, a voltage Vpgm 2 is applied to one of the electrodes of the resistive change element 2, and a voltage Vpgm 1 that is higher than the voltage Vpgm 2 is applied to the other of the electrodes via a p-channel transistor 31. A voltage Vcomp that is lower than the voltage Vpgm 1 is applied to the gate of the p-channel transistor 31. The maximum current flowing through the resistive change element 2 during a program operation may be controlled by controlling the magnitude of the voltage Vcomp.

A plurality of limited current values may be set in the example shown in FIG. 13A by changing the value of the voltage Vcomp. FIG. 13B shows another example, in which a combination of a plurality of p-channel transistors 31 and a selector 15 are prepared to control the current. In this case, the p-channel transistors 31 are designed in such a manner that the driving capability differs among them, and the amount of current obtained from the same amount of voltage differs among them. Specifically, the transistors are formed so that the channel width, the gate length, and/or the thickness of the gate insulating film or the channel impurity concentration of the respective transistors may differ. In programming a resistive change element, the resistive change element and one of the transistors are connected in accordance with the required value of the limited current.

As described above, the variations in resistance value of the resistive change element after a program operation may be suppressed by applying a voltage to the resistive change element via a current limitation circuit in order to prevent an overcurrent from flowing through the resistive change element in the program operation.

As described above, the look-up table circuit according to the second embodiment includes nonvolatile resistive change elements as memory cells, which may be highly integrated.

Although the number of bit lines in the second embodiment is two, the number may be three or more.

(Third Embodiment)

Figure 14:
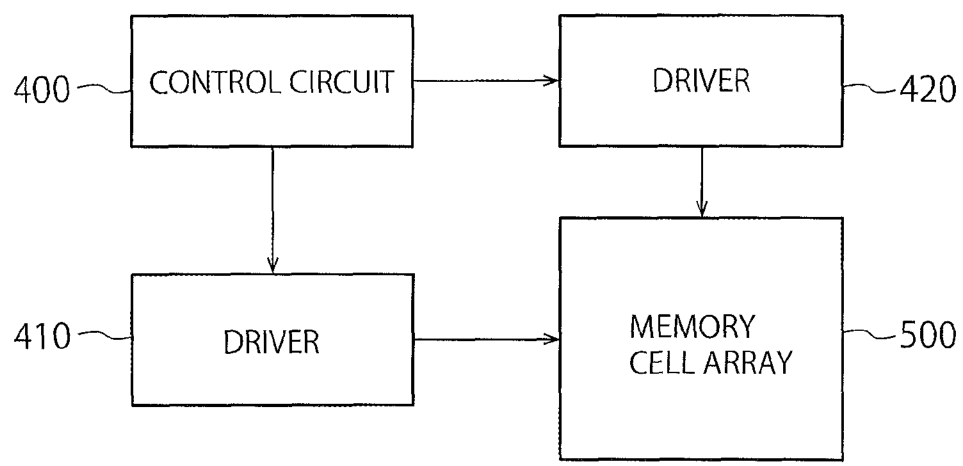
FIG. 14 is a block diagram showing a nonvolatile memory device according to a third embodiment.

FIG. 14 shows a nonvolatile memory device according to a third embodiment. The nonvolatile memory device according to the third embodiment includes a plurality of resistive change elements 2 shown in FIG. 2 or 3 arranged in an array form. In order to apply the set voltage or reset voltage to a predetermined resistive change element, the nonvolatile memory device shown in FIG. 14 may be used. A memory cell array 500 in the third embodiment includes a plurality of resistive change elements, and Is connected to a driver 410 and a driver 420. The drivers 410 and 420 receive control signals from a control circuit 400, and apply a program voltage to a selected resistive change element based on the control signals. Similarly, the drivers 410 and 420 may apply predetermined voltages to non-selected resistive change elements based on the control signals, and may cause the potential of the electrodes of a predetermined resistive change element to be in a floating state.

Figure 15:
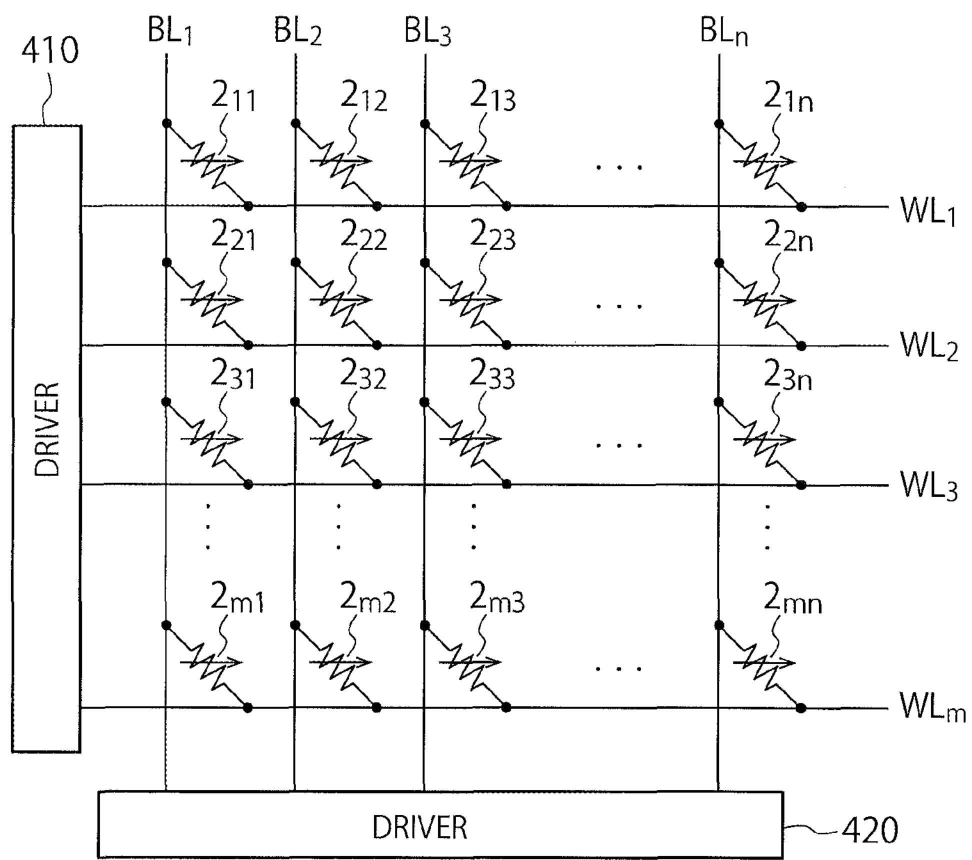
FIG. 15 is a circuit diagram showing a specific configuration of the nonvolatile memory device according to the third embodiment.

FIG. 15 shows an example of a specific configuration of the memory cell array 500, the driver 410, and the driver 420. This circuit includes m word lines $WL_i$ ($1 \le i \le m$), n bit lines $BL_j$ ($1 \le j \le n$), and resistive change elements $\mathbf{2}_{ij}$ disposed in intersection regions of these wiring lines. When a resistive change element, for example the resistive change element $\mathbf{2}_{23}$, is programmed, the driver 410 applies a predetermined voltage to the word line $WL_2$ to which the resistive change element $\mathbf{2}_{23}$ is connected, and the driver 420 applies a predetermined voltage to the bit line $BL_3$ to which the resistive change element $\mathbf{2}_{23}$ is connected.

The nonvolatile memory device with this configuration is capable of increasing the reset voltage. As a result, even if a power supply voltage is applied to a resistive change element in a read operation, the resistive change element may not be reset. Therefore, the data written to the resistive change element may be prevented from being broken.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A look-up table circuit comprising:
first wiring lines;
second wiring lines crossing the first wiring lines;
a plurality of resistive change elements disposed to intersect regions of the first wiring lines and the second wiring lines, each resistive change element including a first electrode connected to a corresponding one of the first wiring lines, a second electrode connected to a corresponding one of the second wiring lines, and a resistive change layer disposed between the first electrode and the second electrode;
a first controller configured to control voltages applied to the first wiring lines;
a second controller configured to control voltages applied to the second wiring lines; and
a multiplexer including input terminals connected to the first wiring lines and an output terminal,
wherein:
the first controller selects one of the first wiring lines and applies a first voltage to the selected one of the first wiring lines;
the second controller selects one of the second wiring lines, and applies a second voltage that is higher than the first voltage to the selected one of the second wiring lines;
the first controller applies a third voltage that is between the first voltage and the second voltage to non-selected first wiring lines; and
the second controller applies a fourth voltage that is between the first voltage and the second voltage to non-selected second wiring lines.

2. The circuit according to claim 1, wherein the resistive change layer of the resistive change element includes hafnium oxynitride.

3. The circuit according to claim 1, wherein the resistive change layer of the resistive change element includes hafnium oxide.

4. The circuit according to claim 1, wherein one of the first electrode and the second electrode of the resistive change element includes nickel.

5. The circuit according to claim 1, wherein one of the first electrode and the second electrode of the resistive change element includes titanium nitride.

6. The circuit according to claim 1, further comprising first transistors disposed between the second controller and the second wiring lines.

7. The circuit according to claim 1, further comprising second transistors disposed between the first controller and the first wiring lines.

8. A look-up table circuit comprising:
first wiring lines;
second wiring lines crossing the first wiring lines;
a plurality of resistive change elements disposed to intersect regions of the first wiring lines and the second wiring lines, each resistive change element including a first electrode connected to a corresponding one of the first wiring lines, a second electrode connected to a corresponding one of the second wiring lines, and a resistive change layer disposed between the first electrode and the second electrode;
a first controller configured to control voltages applied to the first wiring lines;
a second controller configured to control voltages applied to the second wiring lines;
current limitation circuits corresponding to the first wiring lines, the current limitation circuits being configured to limit a current flowing through one of the resistive change elements connected to the corresponding first wiring line when the one of the resistive change elements is to be programmed; and
a multiplexer including input terminals connected to the first wiring lines and an output terminal,
wherein:
the first controller selects one of the first wiring lines and applies a first voltage to the selected one of the first wiring lines;
the second controller selects one of the second wiring lines, and applies a second voltage that is higher than the first voltage to the selected one of the second wiring lines;
the first controller applies a third voltage that is between the first voltage and the second voltage to non-selected first wiring lines; and
the second controller applies a fourth voltage that is between the first voltage and the second voltage to non-selected second wiring lines.

9. The circuit according to claim 8, wherein the resistive change layer of the resistive change element includes hafnium oxynitride.

10. The circuit according to claim 8, wherein the resistive change layer of the resistive change element includes hafnium oxide.

11. The circuit according to claim 8, wherein one of the first electrode and the second electrode of the resistive change element includes nickel.

12. The circuit according to claim 8, wherein one of the first electrode and the second electrode of the resistive change element includes titanium nitride.

13. The circuit according to claim 8, further comprising first transistors disposed between the second controller and the second wiring lines.

14. The circuit according to claim 8, further comprising second transistors disposed between the first controller and the first wiring lines.

15. A look-up table circuit comprising:
first wiring lines;
second wiring lines crossing the first wiring lines;
a plurality of resistive change elements disposed to intersect regions of the first wiring lines and the second wiring lines, each resistive change element including a first electrode connected to a corresponding one of the first wiring lines, a second electrode connected to a corresponding one of the second wiring lines, and a resistive change layer disposed between the first electrode and the second electrode;
a first controller configured to control voltages applied to the first wiring lines, the first controller including an n-channel transistor of which a source is grounded, and a drain is connected to at least one of the first wiring lines;
a second controller configured to control voltages applied to the second wiring lines, the second controller including a p-channel transistor of which a source is connected to a power supply configured to generate a program voltage, and a drain is connected at least one of the second wiring lines; and
a multiplexer including input terminals connected to the first wiring lines and an output terminal, wherein:

the first controller select one the first wiring lines and applies a first voltage to the selected one of the first wiring lines;

the second controller selects one of the second wiring lines, and applies a second voltage that is higher than the first voltage to the selected one of the second wiring lines;

the first controller applies a third voltage that is between the first voltage and the second voltage to non-selected first wiring lines; and the second controller applies a fourth voltage that is between the first voltage and the second voltage to non-selected second wiring lines.

16. The circuit according to claim 15, wherein the first controller further includes current limitation circuits configured to limit a current flowing through the resistive change elements.

17. The circuit according to claim 15, wherein the resistive change layer of the resistive change element includes hafnium oxynitride.

18. The circuit according to claim 15, wherein the resistive change layer of the resistive change element includes hafnium oxide.

19. The circuit according to claim 15, wherein one of the first electrode and the second electrode of the resistive change element includes nickel.

20. The circuit according to claim 15, wherein one of the first electrode and the second electrode of the resistive change element includes titanium nitride.

21. The circuit according to claim 15, further comprising first transistors disposed between the second controller and the second wiring lines.

22. The circuit according to claim 15, further comprising second transistors disposed between the first controller and the first wiring lines.

23. A nonvolatile memory device comprising:

first wiring lines;

second wiring lines crossing the first wiring lines;

a plurality of resistive change elements disposed to intersect regions of the first wiring lines and the second wiring lines, at least one of the resistive change elements including a first electrode connected to a corresponding one of the first wiring lines, a second electrode connected to a corresponding one of the second wiring lines, and a resistive change layer with a multilayer structure including a hafnium oxynitride layer and a hafnium oxide layer, the resistive change layer being disposed between the first electrode and the second electrode, the hafnium oxynitride layer being disposed to be closer to at least one of the first electrode and the second electrode than the hafnium oxide layer, the multilayer structure being switchable between a low-resistance state and a high-resistance state;

a first controller configured to control a voltage to be applied to the first wiring lines; and a second controller configured to control a voltage to be applied to the second wiring lines.

24. The memory device according to claim 23, wherein the first electrode includes nickel and the second electrode includes titanium nitride.

* * * * *